(12) United States Patent
Reddy et al.

(10) Patent No.: US 7,161,381 B1
(45) Date of Patent: *Jan. 9, 2007

(54) MULTIPLE SIZE MEMORIES IN A PROGRAMMABLE LOGIC DEVICE

(75) Inventors: Srinivas Reddy, Fremont, CA (US); David Jefferson, Morgan Hill, CA (US); Christopher F. Lane, San Jose, CA (US); Vikram Santurkar, San Jose, CA (US); Richard Cliff, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/787,818

(22) Filed: Feb. 25, 2004

Related U.S. Application Data

(63) Continuation of application No. 10/140,311, filed on May 6, 2002, now Pat. No. 6,720,796.

(60) Provisional application No. 60/289,266, filed on May 6, 2001.

(51) Int. Cl.
*H03K 19/177* (2006.01)
(52) U.S. Cl. .............................. 326/39; 326/41; 326/47
(58) Field of Classification Search ............ 326/38–41, 326/46, 47
See application file for complete search history.

(56) References Cited

U.S. PATENT DOCUMENTS

| 5,991,850 | A | * | 11/1999 | Ryan ........................... 711/105 |
| 6,150,839 | A | * | 11/2000 | New et al. ..................... 326/40 |
| 6,720,796 | B1 | * | 4/2004 | Reddy et al. .................. 326/39 |
| 6,788,104 | B1 | * | 9/2004 | Singh et al. ................... 326/39 |

* cited by examiner

*Primary Examiner*—Anh Q. Tran
(74) *Attorney, Agent, or Firm*—Townsend and Townsend and Crew LLP

(57) ABSTRACT

A programmable logic device (PLD) includes a first memory block and at least a second memory block, where the two memory blocks have different memory sizes.

20 Claims, 4 Drawing Sheets

MULTIPLE SIZE MEMORIES IN A PROGRAMMABLE LOGIC DEVICE

CROSS REFERENCE TO RELATED APPLICATIONS

The present application is a continuation of Ser. No. 10/140,311, filed on May 6, 2002, now U.S. Pat. No. 6,720,796 which claims the benefit of earlier filed provisional application U.S. Ser. No. 60/289,266, entitled MULTIPLE SIZE MEMORIES IN A PROGRAMMABLE LOGIC DEVICE, filed on May 6, 2001, the entire content of which is incorporated herein by reference.

BACKGROUND

1. Field of the Invention

The present invention generally relates to programmable logic devices, and more particularly to programmable logic devices with embedded memory blocks.

2. Description of the Related Art

Programmable memory devices (PLDs) typically have one standard size of embedded memory block. When a block of memory greater than the standard size is desired, these standard sized memory blocks are chained together. However, this can decrease the speed with which the memory can be accessed. When a block of memory less than the standard size is desired, a portion of the standard sized memory block is unused, this is an inefficient use of silicon area.

In some PLDs, look-up-tables may be used as "distributed memory." In these PLDs, the logic elements of the PLD are used as memory rather than having distinct blocks of memory. One disadvantage to using logic elements as memory is that they can be slower than dedicated memory blocks. Additionally, the use of logic elements as memory reduces the logic capacity of the device.

SUMMARY

The present invention relates to a programmable logic device (PLD) with memory blocks. In one embodiment, the PLD includes a first memory block and at least a second memory block, where the two memory blocks have different memory sizes.

DESCRIPTION OF THE DRAWING FIGURES

The present invention can be best understood by reference to the following description taken in conjunction with the accompanying drawing figures, in which like parts may be referred to by like numerals:

DETAILED DESCRIPTION

In order to provide a more thorough understanding of the present invention, the following description sets forth numerous specific details, such as specific configurations, parameters, and the like. It should be recognized, however, that such description is not intended as a limitation on the scope of the present invention, but is intended to provide a better description of exemplary embodiments.

Figure 1:
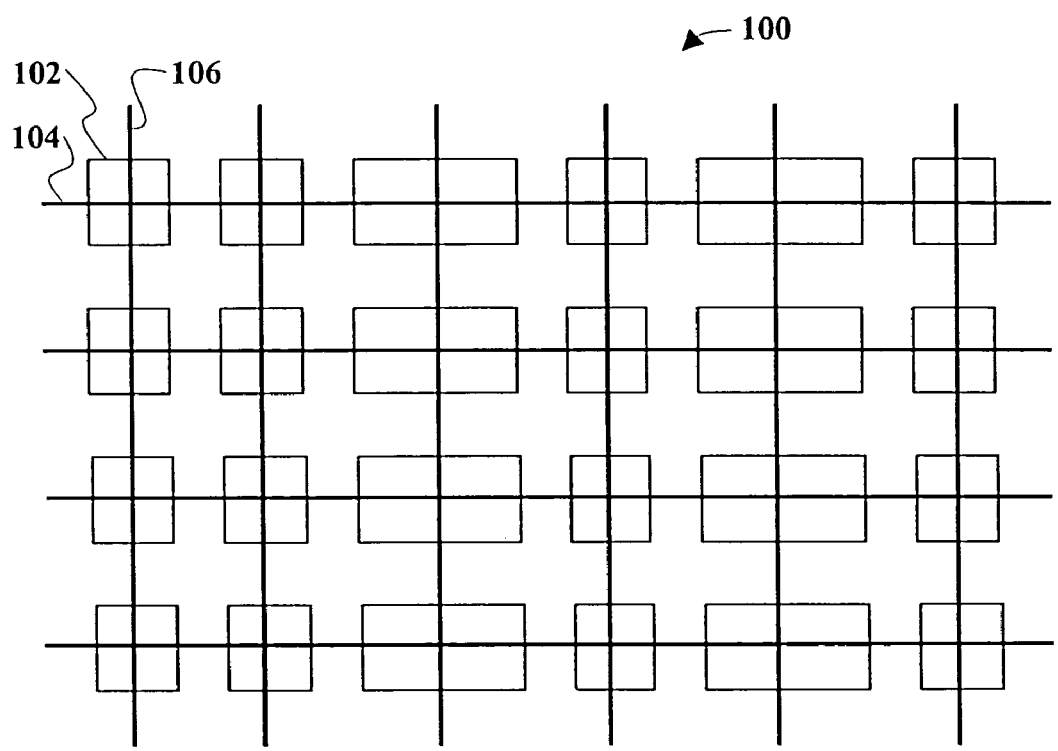
FIG. 1 is a simplified block diagram of an exemplary programmable logic device (PLD)

With reference to FIG. 1, in one exemplary embodiment, a programmable logic device (PLD) 100 includes a plurality of functional blocks arranged in columns and rows. More particularly, FIG. 1 depicts a plurality of logic array blocks (LABs) 102. Each LAB 102 includes a plurality of programmable logic resources that can be configured or programmed to perform logical functions, such as AND, OR, NOT, XOR, NAND, NOR, and the like.

Although FIG. 1 depicts a limited number of LABs 102 arranged in a particular configuration, it should be noted that PLD 100 can include any number of LABs 102 arranged in various configurations. Additionally, it should be noted that PLD 100 can include any digital logic circuit configured by an end-user, and can be known by various names or terms, such as PAL, PLA, FPLA, EPLD, CPLD, EEPLD, LCA, FPGA, and the like.

With continued reference to FIG. 1, PLD 100 includes a routing architecture that connects to each LAB 102. As depicted in FIG. 1, in the present embodiment, the routing architecture includes an array of horizontal lines ("H-lines") 104 and vertical lines ("V-lines") 106.

In one preferred embodiment, each H-line and V-line of the routing architecture include sets of lines that span different numbers of functional blocks of PLD 100. More particularly, in the present embodiment, each H-line includes a set of H4, H8, and H24 lines that span 4, 8, and 24 functional blocks of PLD 100, respectively. In a similar fashion, each V-line includes a set of V4, V8, and V16 lines that span 4, 8, and 16 functional blocks of PLD 100, respectively. The H-lines and the V-lines can be staggered, i.e., the start and end points of each line can be offset by some number of functional blocks. Some of the H-lines can drive a signal to the right, while some can drive a signal to the left. Similarly, some of the V-lines can drive a signal upwards, while some can drive a signal downwards. For a more detailed description of the routing architecture, see co-pending U.S. patent application Ser. No. 10/057,232, titled SYSTEM AND METHOD FOR ASYMMETRIC ROUTING LINES, filed on Jan. 25, 2002, the entire content of which is incorporated herein by reference.

Figure 2:
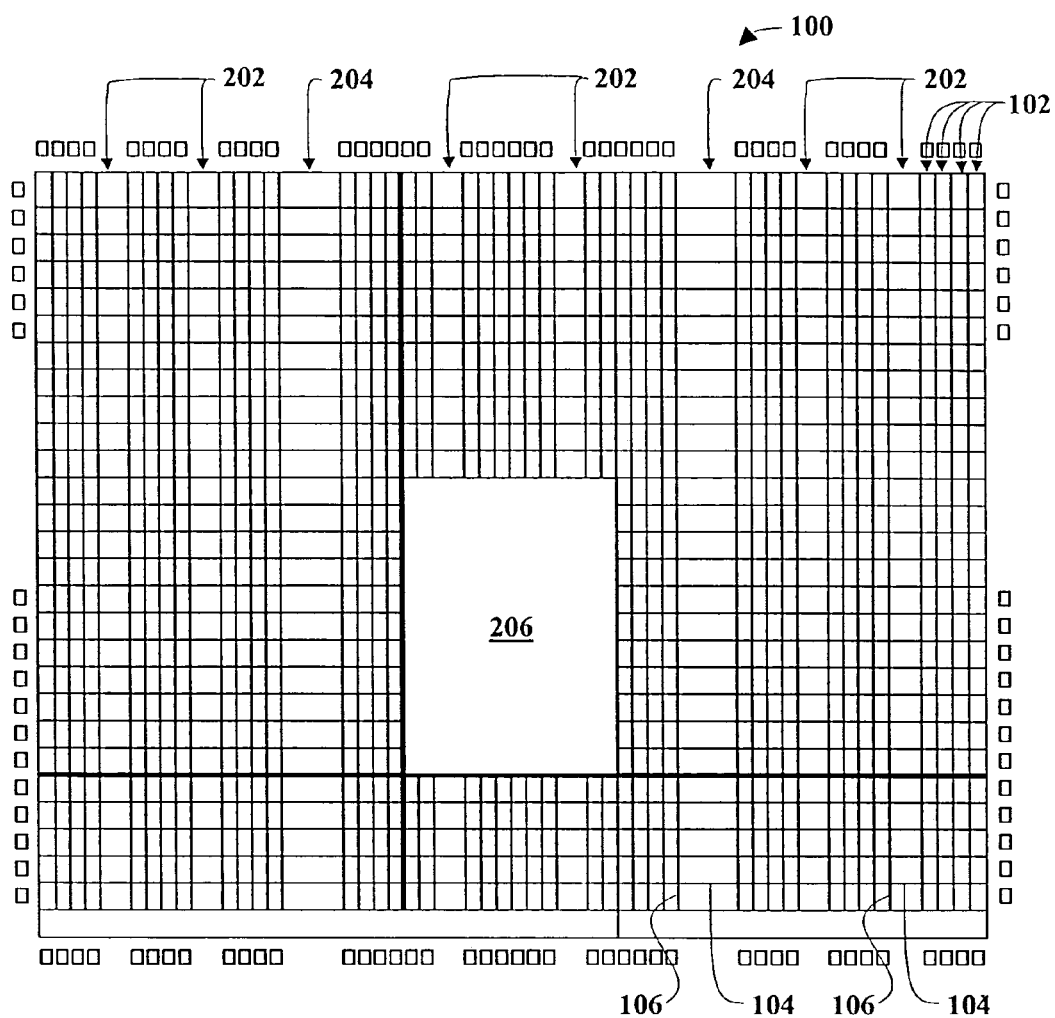
FIG. 2 is a simplified block diagram of a portion of an exemplary PLD having multiple sized embedded memory blocks.

With reference now to FIG. 2, in one exemplary embodiment, PLD 100 includes more than one distinct size of embedded memory. More particularly, in one preferred embodiment, PLD 100 includes three distinct sizes of embedded memory. As depicted in FIG. 2, the present preferred embodiment of PLD 100 includes a Small-Embedded-memory Block (SEAB) 202, a Medium-Embedded-memory Block (MEAB) 204, and a Mega-RAM block (MRAM) 206, each with its own set of control logic and circuits. It should be noted that the names assigned to these different memory blocks are arbitrary and provided primarily for the sake of clarity and convenience.

In the present embodiment, SEABs 202 and MEABs 204 can have configurable depth and width down to a width of 1, with a corresponding increase in depth, which facilitates their use for a number of data rate changing applications. MRAM 206 can be configured as a block of memory in the order of about 64 Kbytes, which facilitates its use for larger amounts of on-chip data storage.

In one preferred configuration, each SEAB 202 is configured with depth and width of 32×18 (32 words deep and 18 bits wide) for a total of 576 bits. Each MEAB 204 is configured with depth and width of 128×36 (128 words deep and 36 bits wide) for a total of 4608 bits. MRAM 206 is configured with depth and width of 64K×9 (64 Kilobytes deep and a minimum word width of 9 bits) for a total bit count of 589824 bits. The width of the words in MRAM 206 can be increased to 144 with a corresponding decrease in depth to 4K words. As noted earlier, it should be noted that SEABs 202, MEABs 204, and MRAM 206 can be configured with various depths and width. Additionally, groups or individual SEABs 202, MEABs 204, and MRAMs 206 can be configured to have different depth and width.

Although in this preferred configuration the difference in size between SEABs 202 and MEABs 204 is relatively small in comparison to the difference between MEABs 204 and MRAM 206, it should be noted that this difference is somewhat arbitrary and can vary depending on the particular application. For example, in some applications, the difference in the sizes of SEABs 202, MEABs 204, and MRAM 206 can be proportionally even.

In one exemplary application, SEABs 202 can be used to perform functions that have relatively shallow depth of memory in comparison to MEABs 204 and MRAM 206 (i.e., fewer words can be stored at a time in SEABs 202 in comparison to MEABs 204 and MRAM 206). For example, SEABs 202 can be used to build shallow FIFOs and shift registers. SEABs 202 can also be used to store the parity information for a larger separate memory, which can make the larger memory more reliable.

MEABs 204 can be used to perform larger depth and width functions than SEABs 202. For example, MEABs 204 can also be used to build larger FIFOs and shift registers than SEAB 202. Additionally, the larger width of MEABs 204 can support more parallel inputs into the memory.

MRAM 206 can be used for larger amounts of on-chip data storage than SEABs 202 and the MEABs 204. Additionally, a block of data stored in MRAM 206 can be accessed faster than storing the block of data in multiple SEABs 202 or MEABs 204. MRAM 206 can also be used as an on-chip cache and/or a scratch pad memory with PLD 100 for storing large amounts of data. This has the advantage of allowing a user of PLD 100 to access the memory faster than going off-chip to access a separate memory device.

Similar to the differences in their sizes, it should be noted that the functional distinctions described above for SEABs 202, MEABs 204, and MRAM 206 are somewhat arbitrary and can vary depending on the application. For example, in some applications, SEABs 202, MEABs 204, and MRAM 206 can be used to perform essentially the same functions.

Although the present embodiment of PLD 100 is depicted and described as having three distinct sizes of embedded memory, it should be recognized that PLD 100 can include two distinct sizes of embedded memory rather than three. For example, PLD 100 can include a combination of two of the three distinct sizes of memory mentioned above (i.e., SEAB 202, MEAB 204, and MRAM 206). Additionally, PLD 100 can include more than three distinct sizes of memory.

As depicted in FIG. 2, in the present embodiment, PLD 100 is configured with multiple columns of SEABs 202 and MEABs 204. More particularly, PLD 100 is depicted as having 6 columns, 27 rows of SEABs 202 and 2 columns, 27 rows of MEABs 204. In contrast, PLD 100 is depicted as having a single MRAM 206. As mentioned earlier, it should be recognized, however, that PLD 100 can include any number of SEABs 202, MEABs 204, and MRAMs 206. For example, FIG. 2 can be viewed as depicted just a portion, such as a single quadrant, of PLD 100.

As further depicted in FIG. 2, similar to LABs 102, SEABs 202 and MEABs 204 are connected to H-lines 104 and V-lines 106. As such, SEABs 202 and MEABs 204 can be accessed in the same manner as LABs 102 through the routing architecture of PLD 100. It should be noted, however, that PLD 100 can be configured with any number of SEABs 202 and MEABs 204, including just one of each, in various configurations.

In contrast to SEABs 202 and MEABs 204, FIG. 2 depicts MRAM 206 spanning multiple H-lines 104 and V-lines 106. As such, in the present embodiment, PLD 100 includes interface regions configured to interface MRAM 206 into the routing architecture of PLD 100.

Figure 3:
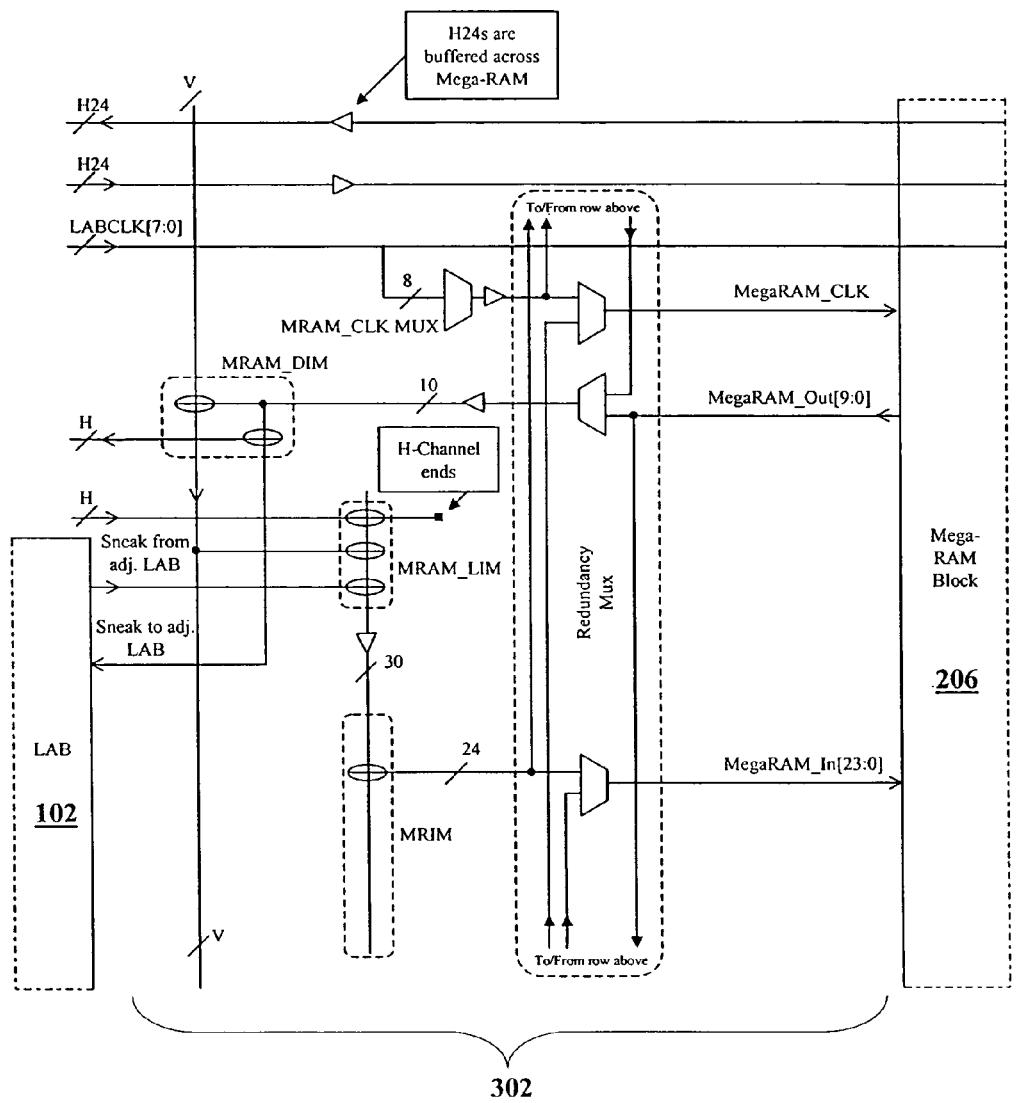
FIG. 3 is a portion of the PLD depicted in FIG. 2.
Figure 4:
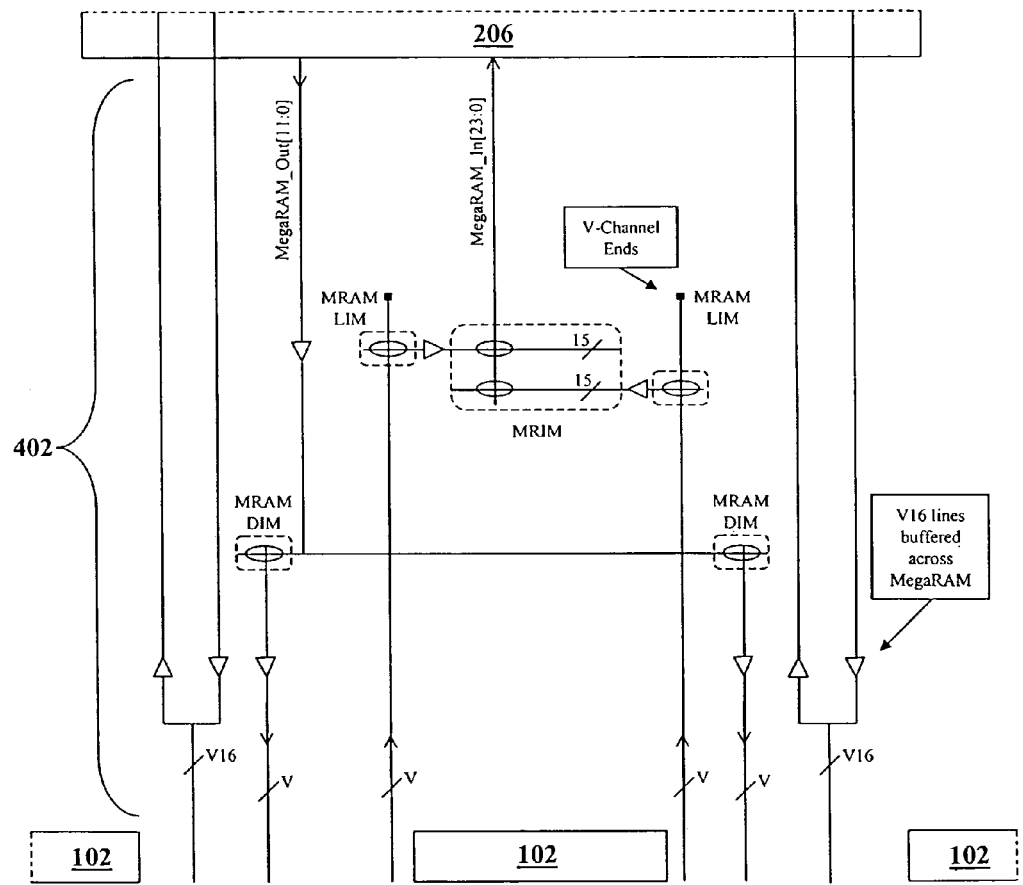
FIG. 4 is another portion of the PLD depicted in FIG. 2.

More particularly, in one preferred embodiment, MRAM 206 can be bordered on solely one, two, or three sides by an interface region. As an example, FIG. 3 depicts a portion of an interface region along what is depicted as being the vertical side of MRAM 206, and FIG. 4 depicts a portion of an interface region along what is depicted as being the horizontal side of MRAM 206. As depicted in FIG. 2, MRAM 206 spans multiple columns and multiple rows of LABs 102, and therefore interfaces with many lines ("channels") of routing lines. In the present embodiment, some of these routing lines do not cross MRAM 206. Rather, some of the routing lines "dead ends" at the interface regions. More particularly, the H4, H8, V4, and V8 lines dead end at the interface regions, while the H24 and V16 lines cross MRAM 206.

In the portion of the interface regions depicted in FIGS. 3 and 4, the H24 (FIG. 3) and V16 (FIG. 4) routing lines are buffered across MRAM 206. With reference to FIG. 3, MRAM interface 302 connects MRAM 206 to an adjacent row. With reference to FIG. 4, MRAM interface 402 connects MRAM 206 to a pair of adjacent columns. One MRAM interface is provided for every row and every pair of columns that MRAM 206 spans. For a more detailed description of the interface regions, see co-pending U.S. application Ser. No. 10/057,442, titled PLD ARCHITECTURE FOR FLEXIBLE PLACEMENT OF IP FUNCTION BLOCKS, filed on Jan. 25, 2002, the entire content of which is incorporated herein by reference.

Although the present invention has been described in conjunction with particular embodiments illustrated in the appended drawing figures, various modifications can be made without departing from the spirit and scope of the invention. Therefore, the present invention should not be construed as limited to the specific forms shown in the drawings and described above.

We claim:

1. An integrated circuit comprising:
   a plurality of programmable logic elements configurable to implement user-defined logic functions;
   a first embedded memory coupled to a first set of the plurality of programmable logic elements, the first embedded memory having a first size, and a configurable width and depth; and
   a second embedded memory coupled to a second set of the plurality of programmable logic elements, the second embedded memory having a second size, and a configurable width and depth,
   wherein the first size is larger than the second size.

2. The integrated circuit of claim 1 further comprising:
   a third embedded memory coupled to a third set of the plurality of programmable logic elements, the third embedded memory having a third size, and a configurable width and depth, wherein the second size is larger than the third size.

3. The integrated circuit of claim 2 further comprising:
control logic for the third embedded memory, wherein the control logic is configurable such that the third embedded memory forms a first-in-first-out memory.

4. The integrated circuit of claim 2 further comprising:
control logic for the third embedded memory, wherein the control logic is configurable such that the third embedded memory forms a shift register.

5. The integrated circuit of claim 2 wherein the integrated circuit is a field programmable gate array.

6. The integrated circuit of claim 2 wherein the second embedded memory is a memory in a column of embedded memories, each having the second size.

7. The integrated circuit of claim 2 wherein the second embedded memory is a memory in a first column of embedded memories, each having the second size, and the third embedded memory is a memory in a second column of embedded memories, each having the third size.

8. The integrated circuit of claim 2 wherein the first, second, and third embedded memories are random-access memories.

9. An integrated circuit comprising:
a plurality of programmable logic elements configurable to implement user-defined logic functions;
a first embedded memory coupled to a first set of the plurality of programmable logic elements, the first embedded memory having a first size; and
a second embedded memory including a first control logic circuit coupled to a second set of the plurality of programmable logic elements, the second embedded memory having a second size, wherein the first size is larger than the second size, and wherein the first control logic circuit is configurable such that the second embedded memory forms first-in-first-out memory.

10. The integrated circuit of claim 9 further comprising:
a third embedded memory including a second control logic circuit coupled to a third set of the plurality of programmable logic elements, the third embedded memory having a third size, wherein the second size is larger than the third size, and wherein the second control logic circuit is configurable such that the third embedded memory forms first-in-first-out memory.

11. The integrated circuit of claim 10 wherein the first and second control logic circuits are also configurable such that the second and third embedded memories form shift registers.

12. The integrated circuit of claim 10 wherein the first, second, and third embedded memories are configurable in width and depth.

13. The integrated circuit of claim 10 wherein the integrated circuit is a field programmable gate array.

14. The integrated circuit of claim 10 wherein the second embedded memory is a memory in a column of embedded memories, each having the second size.

15. The integrated circuit of claim 10 wherein the second embedded memory is a memory in a first column of embedded memories, each having the second size, and the third embedded memory is a memory in a second column of embedded memories, each having the third size.

16. An integrated circuit comprising:
a plurality of programmable logic elements arranged in a plurality of rows and columns and configurable to implement user-defined logic functions;
a first embedded memory coupled to a first set of the plurality of programmable logic elements, the first embedded memory having a first size;
a first plurality of columns of embedded memories, each embedded memory having a second size; and
a second plurality of columns of embedded memories, each embedded memory having a third size, wherein the first size is larger than the second size, and the second size is larger than the third size.

17. The integrated circuit of claim 16 further comprising:
control logic for at least one of the embedded memories in the second plurality of columns of embedded memories, wherein the control logic is configurable such that the embedded memory forms a first-in-first-out memory.

18. The integrated circuit of claim 16 further comprising:
control logic for at least one of the embedded memories in the second plurality of columns of embedded memories, wherein the control logic is configurable such that the embedded memory forms a shift register.

19. The integrated circuit of claim 16 wherein the integrated circuit is a field programmable gate array.

20. The integrated circuit of claim 16 wherein the first embedded memory, and each of the embedded memories in the first and second pluralities of columns of embedded memories are configurable in width and depth.

\* \* \* \* \*